United States Patent [19]

Eibl et al.

[11] Patent Number: 4,969,066
[45] Date of Patent: Nov. 6, 1990

[54] ELECTRONIC MODULE

[75] Inventors: Erwin Eibl, Amberg; Heinz Schmidt, Kuemmersbruck; Heribert Rester, Steinberg, all of Fed. Rep. of Germany

[73] Assignee: Siemens Aktiengesellschaft, Berlin & Munich, Fed. Rep. of Germany

[21] Appl. No.: 373,398

[22] Filed: Jun. 30, 1989

[30] Foreign Application Priority Data

Jul. 7, 1988 [DE] Fed. Rep. of Germany ....... 8808743

[51] Int. Cl.$^5$ ............................................. H05K 7/20
[52] U.S. Cl. ..................................... 361/413; 361/392; 165/80.3
[58] Field of Search .................... 165/80.3; 98/58, 60; 174/16.1; 361/382, 383, 384, 412, 413, 415, 395, 399, 392

[56] References Cited

U.S. PATENT DOCUMENTS

| 3,447,039 | 5/1969 | Branagan | 361/412 |
| 3,609,464 | 9/1971 | Stone | 361/412 |
| 3,742,309 | 6/1973 | Sterner | 361/413 |
| 3,811,154 | 5/1974 | Lindeman | 361/412 |
| 4,327,398 | 4/1982 | Christison | 165/80.3 |
| 4,571,663 | 2/1986 | McPherson | 361/412 |
| 4,823,233 | 4/1989 | Brown | 361/412 |

Primary Examiner—Gerald P. Tolin
Attorney, Agent, or Firm—Kenyon & Kenyon

[57] ABSTRACT

An electronic module includes two printed-circuit boards which are equipped with hybrid assemblies. The electronic module takes up only a small amount of space and, at the same time, efficiently dissipates the heat loss caused by the hybrid assemblies. The hybrid assemblies are arranged in such a manner that they can be interspersed with one another, similar to a sandwich-type construction. The interspersing provides duct-type, perpendicularly aligned interspaces between the hybrid assemblies, allowing the heat loss to be dissipated in a chimney-like fashion.

9 Claims, 1 Drawing Sheet

ELECTRONIC MODULE

FIELD OF THE INVENTION

The invention relates to an electronic module and, more particularly, to an electronic module including at least two component supports mounted in a parallel manner. The component supports are provided with electric subassemblies and circuit-board conductors.

BACKGROUND OF THE INVENTION

Electronic modules are known having component supports and electric subassemblies as shown in the German design patent 19 62 067. The German patent shows several carrier plates having structural elements that are stacked one on top of another. The carrier plates are connected by way of flexible printed-circuit boards. The printed circuit boards serve as the electric interconnection between the carrier plates. This type of module has a compact construction, however, it does not provide for the use of hybrid assemblies which occupy greater space. Therefore, there is a need for an electronic module arranged such that the carrier plates, which are equipped with hybrid assemblies, only occupy a small amount of space.

SUMMARY OF THE INVENTION

The present invention overcomes the prior art problem by providing an electronic module having at least two component supports which include electric subassemblies. The electronic module is constructed such that the electric subassemblies can be hybrid assemblies which can be accommodated in a small amount of space.

The hybrid assemblies are equipped with electric structural elements on only one of their sides and feature an insulating surface on the other side. Further, each one of the component supports can be coupled with at least one $ other component support by way of at least one range spacer or standoff. Each of the hybrid assemblies are arranged next to each other in an upright manner substantially s perpendicular to the inner side of the two component supports. The two component supports are connected by range spacers. Interspacing of the hybrid assemblies exists at least between one section of a first component support and a section of the other component support. The hybrid assemblies are thus interleaved.

It is an advantage of the present invention that the interspacing, which serves to imbricate the hybrid assemblies, also makes possible the testing and replacing of the structural elements on the hybrid assemblies.

A further advantage of the interspersed arrangement of hybrid assemblies is that an appropriately large interspace can be provided between any two hybrid assemblies having large power losses. This is done so that another hybrid assembly, having a lesser power loss, can be placed in this interspace thus attaining better temperature distribution for the module. If the interspacing between the hybrid assemblies are duct-like, then the heat is efficiently dissipated. This is especially true when the ducts are aligned perpendicularly.

A further advantage is obtained, providing for improved short-circuit protection, when the insulating surfaces of the hybrid assemblies, which are in an interspersed arrangement, face in the same direction. A yet further advantage of the present invention is that it provides a low cost spacer mounting between the component boards. The two component supports, each of which has an electric contact strip including a spacer means, can be mechanically connected over the spacer means to create a low cost spacer mounting. Further, this advantageously makes use of the electric contact strips which are ordinarily present on the component supports. lp A further advantage results when a spacer means features a tubular part having a slit-type opening. A counterpart of the spacer means includes a pin-shaped part which is insertable in the tubular part and is slit on its exposed end. The pin-shaped part also features guide projections which can engage the opening in the tubular part. In this manner, a space-fixed mounting is obtained whereby the pin-shaped part is inserted into the tubular part until it engages the opening. This latched position can easily be released again by pulling apart the spacer means.

It is yet further advantageous to provide the component supports with an electric connecting device. This allows a signal exchange to easily take place between the subassemblies of the component supports. The signal exchange, through the connecting device provided for this purpose, is especially useful because in many cases there is either little or no more space available on the component supports for circuit-board conductors which would otherwise be needed for this purpose.

DETAILED DESCRIPTION

Figure 1:
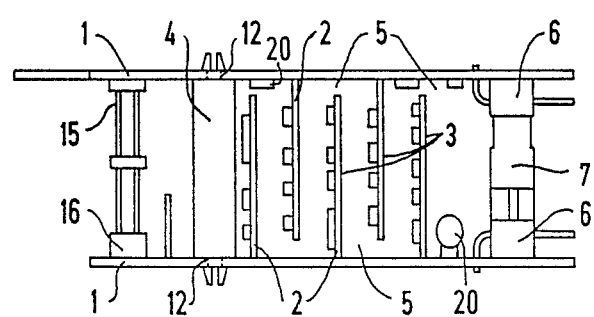
FIG. 1 is a side view of the electronic module of the present invention.

Referring to FIG. 1, there is shown an electronic module including two component supports 1 mounted parallel to each other. The component supports 1 each feature an electric contact strip 6, on which spacer means 7 are provided, possibly in an integral form therewith. Both component supports 1 are assembled having a fixed clearance with respect to each other by way of the spacer means 7 and at least one range spacer 4. In the assembled state, the range spacers 4 are inserted in openings 12 of the component supports I. The range spacers can be easily released from the openings 12 by simply compressing their slit ends.

In addition to the electrical structural elements (shown generally by reference 20), the hybrid assemblies 2 are soldered at one end to their respective component supports 1 on the side facing the opposite component support 1. The hybrid assemblies are arranged perpendicular with respect to the component supports 1.

These hybrid assemblies 2 are interconnected with other structural elements over circuit-board conductors formed on the other side of the respective component support !. The hybrid assemblies 2 are equipped With electric structural elements on only one side and feature an insulating surface 3 on the other side. The hybrid assemblies 2 of one of the component supports 1 are arranged in such a manner to allow for duct-type interspaces 5 between the assemblies 2. Further, at least one hybrid assembly 2 of the opposite component support 1 extends into each of these duct-type interspaces 5. The heat thereby dissipates efficiently through the duct-type interspaces 5, when the assemblies 2 are perpendicularly aligned. This operates similarly to a chimney whereby, in the case of a housing enclosing the electronic module, corresponding vent openings are provided on the top and bottom supports.

Both component supports 1 can be electrically interconnected through the use of an electric connecting device, for example, a male multi-point connector 15 on one component support 1 and a corresponding female multi-point connector 16 on the other component support 1.

Figure 2:
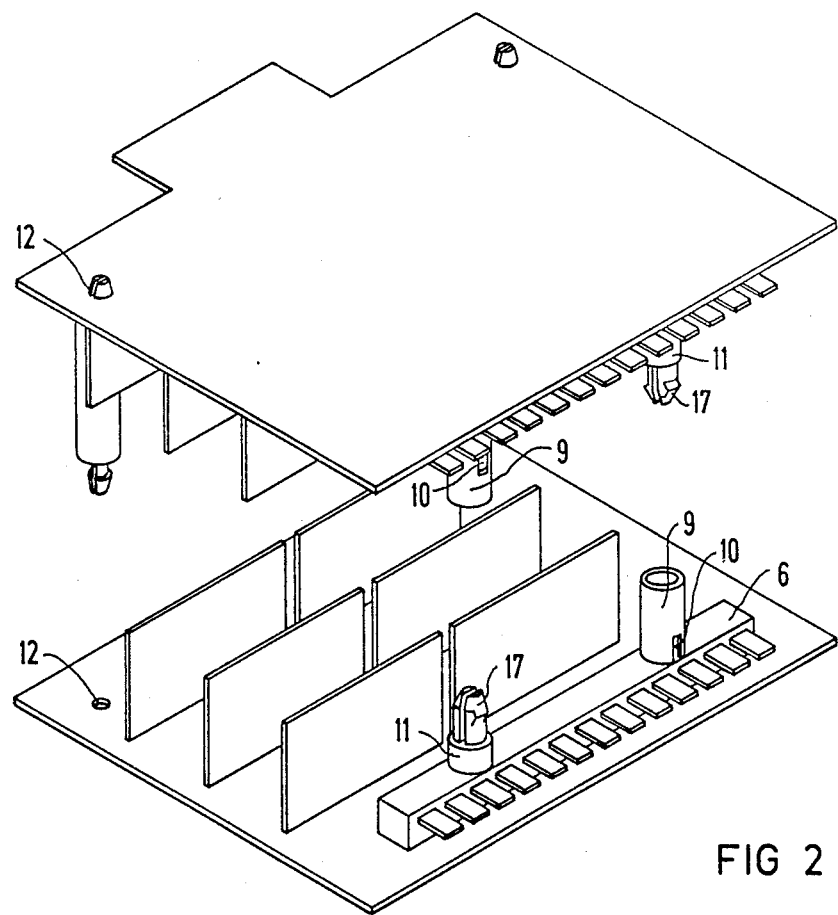
FIG. 2 is a perspective view of the present invention showing the spacer means on the electric contact strip.

FIG. 2 illustrates in a perspective representation the electric contact strips 6 having spacer means 7 for the two component supports 1. The spacer means 7 are located near each end of the contact strips 6. The spacer means 7 include two parts 9 and 11. The two parts 9 and 11 fit into one another in a male/female fashion. The part 9 is tubular and features a slit-like opening 10. A cylindrical part 11 has a slit on its exposed end. The slit is further provided with two guide projections 17. The cylindrical part 11 can be inserted into the part 9 wherein the guide projections 17 engage the opening 10 of the tubular part 9. This latching thereby fixes the position of the component supports 1. The guide projections 17 are beveled in such a way that the latch, positioned in the opening 10, can be released by simply pulling apart the tubular part 9 and the cylindrical part 11. An advantageous implementation provides the contact strips 6 with both a tubular part 9 and a cylindrical part 11 for coupling purposes.

Figure 3:
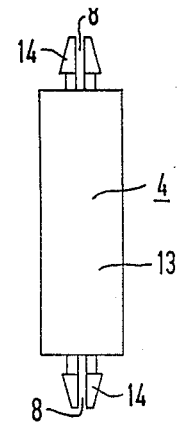
FIG. 3 shows a range spacer used in the present invention.

FIG. 3 illustrates a range spacer 4 having a midsection 13 with two ends being provided with a detention means. The detention means can be, for example, latches 14 having a slit 8. To couple the two component supports 1, corresponding openings are provided in the supports, in this example, holes 12 are used into which the latches 14 of the range spacers 4 engage. Because the ends of the range spacer 4 are slit, the latches 14 can be compressed whereby the range spacer 4 can be easily released from the holes 12.

What is claimed is:

1. An electronic module, comprising:
   (a) at least two component supports provided with circuit board conductors, one of said component supports further having at least two electric subassemblies arranged substantially perpendicular to the component support the other of said component supports further having at least one electric subassembly perpendicular to the component support;
   (b) a range spacer coupling one of said component supports with at least another of said component supports such that the component supports are mounted in parallel;
   (c) each said electric subassembly being a hybrid assembly equipped with an electric structural element on only one side and having an insulating surface on the opposite side; and
   (d) wherein a hybrid assembly is arranged next to another hybrid assembly on the inner side of said one of the component supports forming an interspacing between the hybrid assemblies of the one component support and further wherein the at least one hybrid assembly of the other component support extends into the interspacing.

2. An electronic module according to claim 1 wherein the interspacing formed by the hybrid assemblies is ductlike.

3. An electronic module according to claim 1 wherein the insulating surfaces of the hybrid assemblies face in the same direction.

4. An electronic module according to claim 1, further comprising:
   (a) an electric contact strip mounted on each of said component supports;
   (b) a spacer device mounted on each of said electric contact strips wherein said at least two component supports are mechanically coupled via the spacer device.

5. An electronic module according to claim 1 wherein said at least two component supports further include an electrical coupling device.

6. An electronic module, comprising:
   (a) at least two component supports provided with circuit board conductors, one of said component supports further having at least two electric subassemblies arranged substantially perpendicular to the component support the other of said component supports further having at least one electric subassembly perpendicular to the component support;
   (b) a range spacer coupling one of said component supports with at least another of said component supports such that the component supports are mounted in parallel;
   (c) each said electric subassembly being a hybrid assembly equipped with an electrical structural element on only one side and having an insulating surface on the opposite side; and
   (d) wherein a hybrid assembly is arranged next to another hybrid assembly on the inner side of said one of the component supports forming an interspacing between the hybrid assemblies of the one component support and further wherein the at least one hybrid assembly of the other component support extends into the interspacing;
   (e) an electric contact strip mounted on each of said component supports;
   (f) a spacer device mounted on each of said electric contact strips wherein said at least two component supports are mechanically coupled via the spacer device;
   (g) the space device comprising:
      (i) a tubular part having a slit-type opening at one end;
      (ii) a pin-shaped part having a slit on its exposed end and further having guide projections on said slit end wherein said tubular part, mounted on one of said electric contact strips, couples with said pin-shaped part mounted on an opposite electric contact strip.

7. An electronic module according to claim 6 wherein the interspacing formed by the hybrid assemblies is duct-like.

8. An electronic module according to claim 6 wherein the insulating surfaces of the hybrid assemblies face in the same direction.

9. An electronic module according to claim 6 wherein said at least two component supports further include an electrical coupling device.

* * * * *

UNITED STATES PATENT AND TRADEMARK OFFICE
CERTIFICATE OF CORRECTION

PATENT NO. : 4,969,066

DATED : November 6, 1990

INVENTOR(S) : Eibl et al

It is certified that error appears in the above-identified patent and that said Letters Patent is hereby corrected as shown below:

The title of the invention should read as follows:

--Electronic Module Having Interspersed Electric Subassemblies--

Signed and Sealed this

Ninth Day of July, 1991

Attest:

HARRY F. MANBECK, JR.

*Attesting Officer*  *Commissioner of Patents and Trademarks*